(12) United States Patent
Behammer

(10) Patent No.: US 7,445,975 B2
(45) Date of Patent: Nov. 4, 2008

(54) METHOD FOR THE PRODUCTION OF A SEMICONDUCTOR COMPONENT HAVING A METALLIC GATE ELECTRODE DISPOSED IN A DOUBLE-RECESS STRUCTURE

(75) Inventor: Dag Behammer, Ulm (DE)

(73) Assignee: United Monolithic Semiconductors GmbH, Ulm (DE)

( * ) Notice: Subject to any disclaimer, the term of this patent is extended or adjusted under 35 U.S.C. 154(b) by 11 days.

(21) Appl. No.: 11/800,770

(22) Filed: May 7, 2007

(65) Prior Publication Data

US 2007/0264781 A1  Nov. 15, 2007

(30) Foreign Application Priority Data

May 15, 2006  (DE) ................ 10 2006 022 507

(51) Int. Cl.
*H01L 21/338* (2006.01)

(52) U.S. Cl. .............. 438/182; 438/167; 438/270; 438/574; 438/606; 257/194; 257/E21.205; 257/E21.407; 257/E29.25; 257/E29.135

(58) Field of Classification Search ............ 438/606, 438/182, 167, 270, 574; 257/E21.407, E29.25, 257/194, E21.205, E29.135
See application file for complete search history.

(56) References Cited

U.S. PATENT DOCUMENTS

| | | |
|---|---|---|
| 5,556,797 A | 9/1996 | Chi et al. |
| 5,641,977 A | 6/1997 | Kanamori |
| 5,796,132 A | 8/1998 | Nakano et al. |
| 6,586,319 B1 * | 7/2003 | Hirano ................ 438/574 |
| 2004/0082158 A1 | 4/2004 | Whelan et al. |
| 2004/0157423 A1 * | 8/2004 | Behammer ............ 438/597 |
| 2005/0127398 A1 * | 6/2005 | Taniguchi et al. ......... 257/192 |

\* cited by examiner

*Primary Examiner*—Long K Tran
(74) *Attorney, Agent, or Firm*—Collard & Roe, P.C.

(57) ABSTRACT

A semiconductor component, particularly a pHEMT, having a T-shaped gate electrode deposited in a double-recess structure, is produced with a method with self-adjusting alignment of the recesses and of the T-shaped gate electrode.

8 Claims, 4 Drawing Sheets

METHOD FOR THE PRODUCTION OF A SEMICONDUCTOR COMPONENT HAVING A METALLIC GATE ELECTRODE DISPOSED IN A DOUBLE-RECESS STRUCTURE

BACKGROUND OF THE INVENTION

1. Field of the Invention

The invention relates to a method for the production of a semiconductor component, particularly a pHEMT field effect transistor, having a metallic gate electrode disposed in a double-recess structure.

2. The Prior Art

Semiconductor elements having a gate electrode disposed in a double-recess structure, are known in various embodiments.

In U.S. Pat. No. 5,796,132, the two recesses are assigned to one another by adjustment, and masked by a resist mask or SiN hard mask during etching. Furthermore, isolation is possible, in the case of a pHEMT (Pseudomorphic High Electron Mobility Transistor), only by over-etching on a stop layer. This results in cavities that later can no longer be passivated. The T-shaped gate head is formed, in the method shown, by the etching of a metallization deposited on the entire area. In U.S. Pat. No. 5,556,797, the two recesses are formed self-adjusted relative to one another, but it is not possible to form a low-ohm T-shaped gate head, which is, however, required for high-frequency applications. The same also holds true for U.S. Pat. No. 5,641,977.

U.S. Patent Application Publication No. 2004/0082158 A1 describes a method in which several photo-resist layers are deposited onto the semiconductor layer sequence, in which layers structures for the gate head are prepared, using the lift-off method, for the subsequent production of a T-shaped gate electrode. In the lowermost resist layer, deposited onto the highly doped contact layer of the semiconductor layer sequence, an opening that determines the structure of the gate foot is produced. The resist layers are maintained during the subsequent method steps, up to vapor deposition of the gate metal. Under the lowermost resist layer, a recess structure is produced in the contact layer, by under-etching, up to a barrier layer, and gate metal is deposited through the opening of the lowermost resist layer, to form the gate foot on the barrier layer, and, at the same time, deposited in the structures of the upper resist layers, to form the gate head. The gate electrode is exposed by dissolving the resist layers. Afterwards, ohmic contacts are still produced on the highly doped contact layer.

SUMMARY OF THE INVENTION

It is therefore an object of the invention to provide an advantageous method for the production of a semiconductor component having a metallic gate electrode and a double-recess structure.

The invention comprises a method for the production of a semiconductor component having a metallic gate electrode, having a broader gate head and a narrower gate foot, which is disposed in a double-recess structure having a broad and a narrow recess. A semiconductor layer sequence for a field-effect transistor, particularly a pHEMT transistor, is deposited. This sequence includes a channel layer, above this layer a barrier layer, above this layer a low-doped shielding layer with a stop layer lying on top, and above this layer a highly doped contact layer. An intermediate layer and an auxiliary layer are deposited on the contact layer. A first opening that determines the structure of the gate foot is produced in the auxiliary layer and the intermediate layer, and transferred into the contact layer, up to the stop layer that lies on top of the shielding layer, with the structure of the narrow recess, as a first partial recess.

The auxiliary layer is under-etched with the structure of the broad recess, by selective etching of the intermediate layer. An opening in the stop layer that lies on top of the shielding layer is produced with the first partial recess as a mask. The partial recess in the contact layer is widened to form the broad recess, with the structure in the intermediate layer as a mask.

The narrow recess in the shielding layer is etched up to the barrier layer, with the opening in the stop layer that lies on top of the shielding layer. Gate metal for the gate foot is deposited into the narrow recess, with the opening in the auxiliary layer as a mask, and for the gate head, onto the auxiliary layer.

An etch stop layer that lies on top of the barrier layer may also be produced during deposition of the semiconductor layer sequence. Exposed stop layers that might still remain in the double-recess structure are removed after etching of the double-recess structure and before deposition of the gate metal.

The auxiliary layer and the intermediate layer may be removed after deposition of the gate metal.

In one embodiment, a passivation layer is deposited after removal of the auxiliary layer and the intermediate layer.

The gate head may be produced using the lift-off method.

In another embodiment, the mask for the lift-off method may be produced in resist layers above the auxiliary layer, before production of the double-recess structure, and maintained until deposition of the gate metal.

The opening in the auxiliary layer and the intermediate layer is preferably produced in a self-adjusting manner, relative to a mask structure in the resist layers for the gate head.

The production of the double-recess structure advantageously takes place, by the method according to the invention, with self-adjusting positioning of the broad and the narrow recess, in several steps. Structures that are produced in intermediate steps can advantageously serve as the masking for subsequent etching steps. A self-centering position for the gate foot also occurs within the narrow recess.

In particular, a first partial recess in the contact layer can be exposed with the opening in the auxiliary layer as a hard mask, in an intermediate step, which recess in turn serves to define the narrow recess in the shielding layer. It is advantageous if the shielding layer has a stop layer that lies on top, and the first partial recess is used as masking to etch an opening in this stop layer. The first partial recess is widened in a subsequent step, in order to form the broad recess, and defined under-etching of the auxiliary layer in an intermediate layer serves as masking.

The production of structures, including the production of openings in layers and the exposure of recesses or structures, takes place in conventional manner, by multiple compilation and use of known etching agents, which can particularly be selected and used with material selectivity.

In an advantageous further development, the gate head can also be produced, relative to the gate foot, in a self-adjusting position, for which purpose openings for the shape of the gate head are produced in layers, particularly photo-resist layers above the auxiliary layer, in a self-adjusting manner relative to the structure of the openings in the auxiliary layer that determine the structure of the gate foot. It is advantageous if the production of the openings in the resist layers above the auxiliary layer takes place through first, narrower structures in the resist layer, up to the openings produced in the auxiliary layer in a self-adjusting manner, as the hard mask masking the etching of the recess structure, and subsequent widening of these first structures.

BRIEF DESCRIPTION OF THE DRAWINGS

In the following, the invention will be described in greater detail using a preferred exemplary embodiment, making reference to the figures. In the drawings.

DETAILED DESCRIPTION OF THE PREFERRED EMBODIMENT

The method according to the invention includes integration, which can be scaled and self-adjusted to a high degree, for defining the gate region with gate foot and gate head. In this connection, the gate foot can possess dimensions of 70-600 nm, for example, while the gate head can typically be broader, towards both sides, by 50-300 nm. The gate head is disposed symmetrical to the gate foot, in a self-adjusting manner. The gate electrode, particularly the gate foot, is disposed centered in the double recess, whose broad and narrow recess also lie symmetrical to one another, in a self-adjusting manner.

Figure 1A:
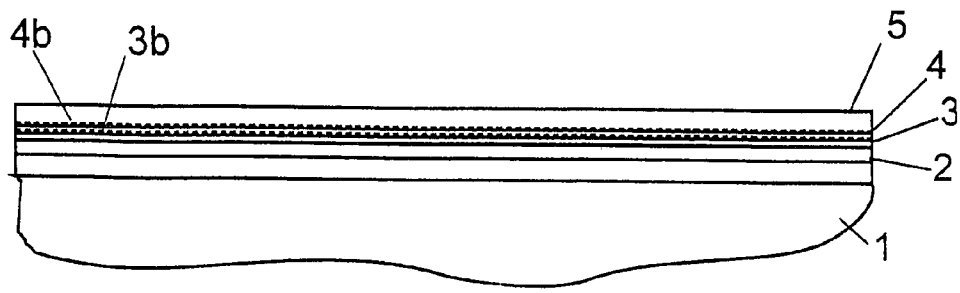
FIG. 1a to FIG. 1l show the method according to the invention in consecutive stages.

Proceeding from the GaAs substrate 0, layers 1-5 in FIG. 1a define the vertical profile of a field-effect transistor, particularly a pHEMT high-frequency power field-effect transistor, which can vary in terms of its thickness structure and elemental structure, as a function of the use. The layer thickness ratios should not be understood as being to scale. Fundamentally, 1 represents the buffer, 2 forms the channel layer for the two-dimensional electron gas, 3 is a barrier layer having a stop layer 3b on top which contributes to the defined etching of the narrow recess, 4 is a low-doped shielding layer, which also ends with a stop layer 4b on top, and the layer 5, as the uppermost semiconductor layer, forms a highly doped contact layer for low-ohm component contacting. Layers 4 and 5 preferably consist of GaAs, and it is advantageous if the stop layers consist of AlAs or InGaP.

Figure 1B:
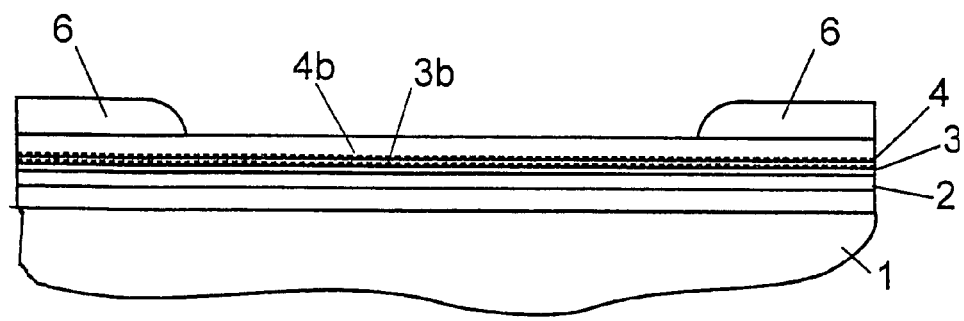
Figure 1C:
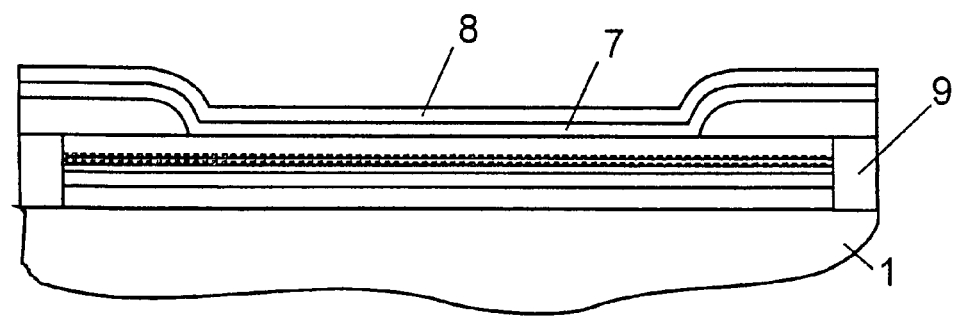

After ohmic contacts 6 are defined on contact layer 5 according to FIG. 1b, deposition of a dielectric intermediate layer 7, preferably an $SiO_2$ layer, and a dielectric auxiliary layer 8, preferably a silicon nitride (SiN) layer, takes place, preferably by means of PECVD (plasma enhanced chemical vapor deposition). The sum of the absolute thickness values of layers 4, 5, 7, and 8 advantageously lies below or not significantly above 150 mm, which is advantageous for the formation of the T-shaped gate metallization. Lateral insulation of the transistors takes place by means of photo-resist-masked implantation 9 (FIG. 1c).

Figure 1D:
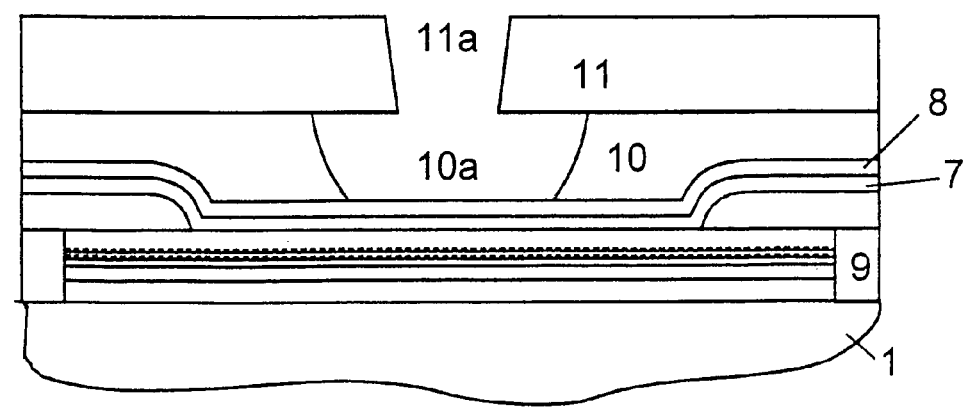

For the next lithography process step, a photo-resist double layer, which preferably consists of PMGI (polymethylglutarimide) as lower resist 10 and a thin positive upper resist 11 on the auxiliary layer, is deposited. An exposure mask is adjusted relative to the ohmic contacts. Opening 11a is formed in the upper resist, and opening 10a in the lower resist, by the selection of suitable exposure parameters. In this connection, 10a is larger than 11a, in order to produce a resist overhang suitable for a lift-off process. This is shown in FIG. 1d.

Figure 1E:
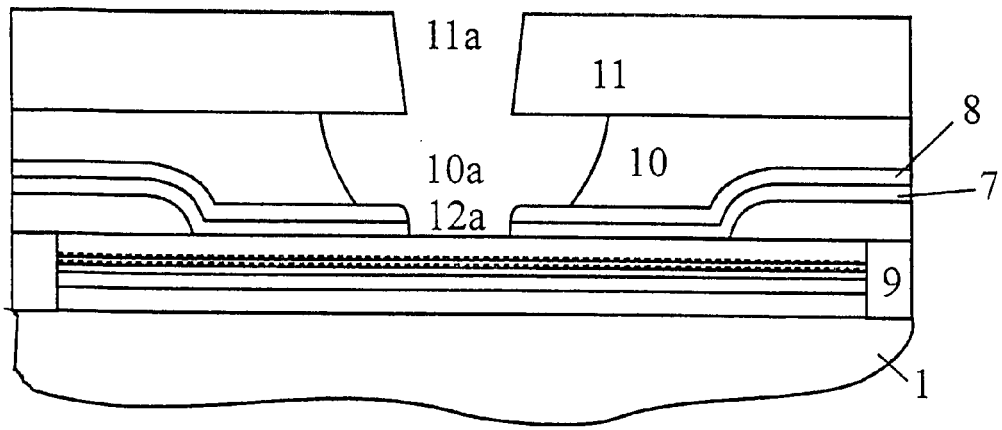

Opening 11a in the upper resist layer also determines the subsequent shape of the gate foot. The resist structure of the upper resist, with the opening 11a, is transferred into auxiliary layer 8 and intermediate layer 7 by means of anisotropic plasma etching. Opening 12a in FIG. 1e is formed, the side walls of which advantageously make a transition, in rounded shape, into the top of auxiliary layer 8, which is advantageous for the subsequent formation of the T-shaped gate metallization.

Figure 1F:
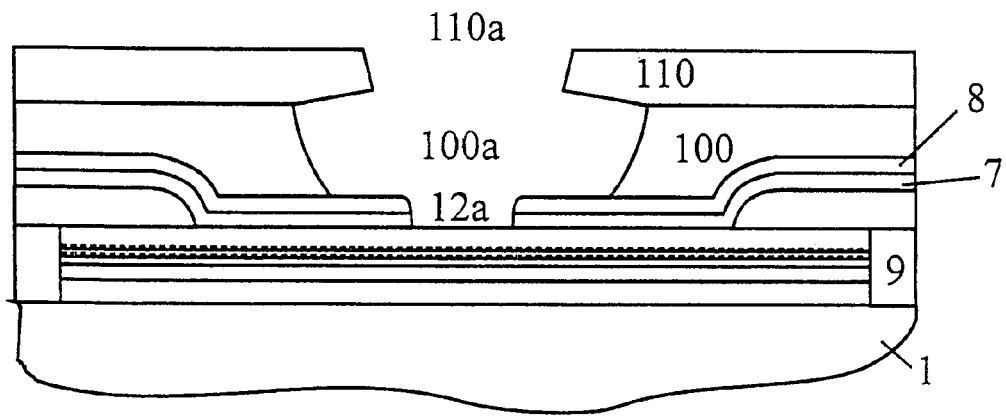

Before other, particularly wet-chemical, etchings define the double-recess structure, the resist structure is widened, for example by an isotropic oxygen plasma, so that opening 110a represents the lateral dimension for the gate head. Opening 100a in the lower resist is advantageously enlarged along with it, so that the overhanging resist structure is maintained (see FIG. 1f).

Figure 1G:
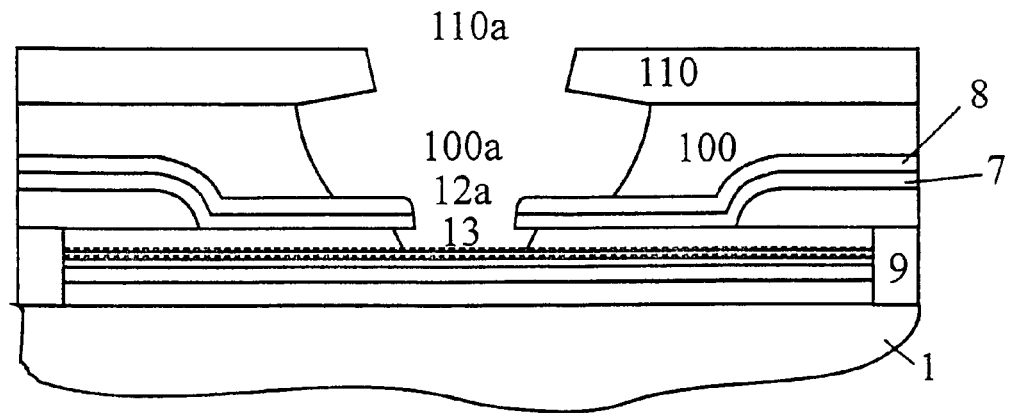
Figure 1H:
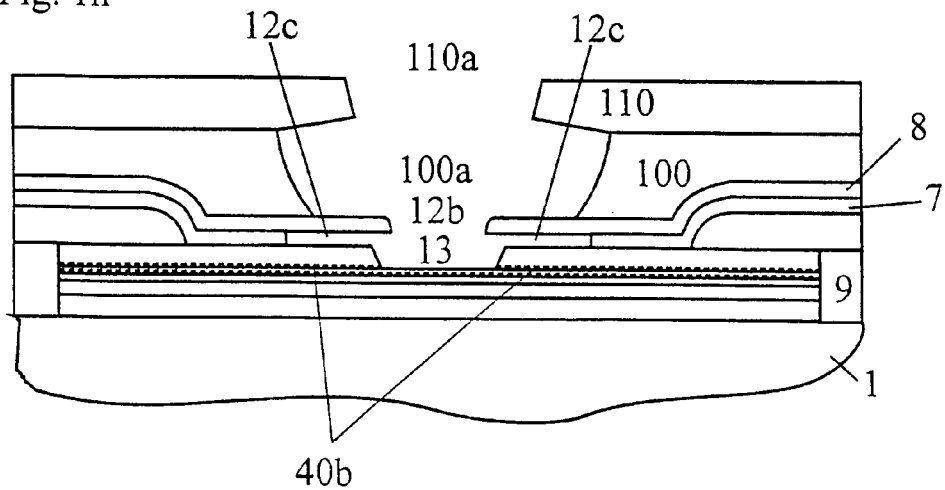

FIG. 1g shows, after a first etching of contact layer 5 up to etch stop layer 4b, with opening 12a as a mask, a first partial recess 13, which is widened laterally relative to the opening 12a, by wet-chemical over-etching. The over-etching is adjusted, for example by the duration of the etching process, in such a manner that the width of partial recess 12 assumes the dimension provided for the narrow recess of the double-recess structure. In the subsequent process step, the oxide layer is laterally removed by highly selective etching of oxide layer 7 relative to auxiliary layer 8 and contact layer 5, so that under-etching 12c widened relative to 13 results (FIG. 1h). The lateral expanse of under-etching 12c can be adjusted very precisely, for example by way of the duration of the etching process, and is selected in such a manner that the lateral edges of the under-etching predetermine the planned lateral dimension of the broad recess. The production of 12c is advantageously carried out with solutions containing HF, and at the same time, stop layer 4b, which preferably consists of AlAs, is locally removed into the partial recess 13, masked by partial recess 13. The opening in auxiliary layer 8 is designated as 12b and possesses essentially the same opening width as opening 12a in double layer 7, 8.

Figure 1I:
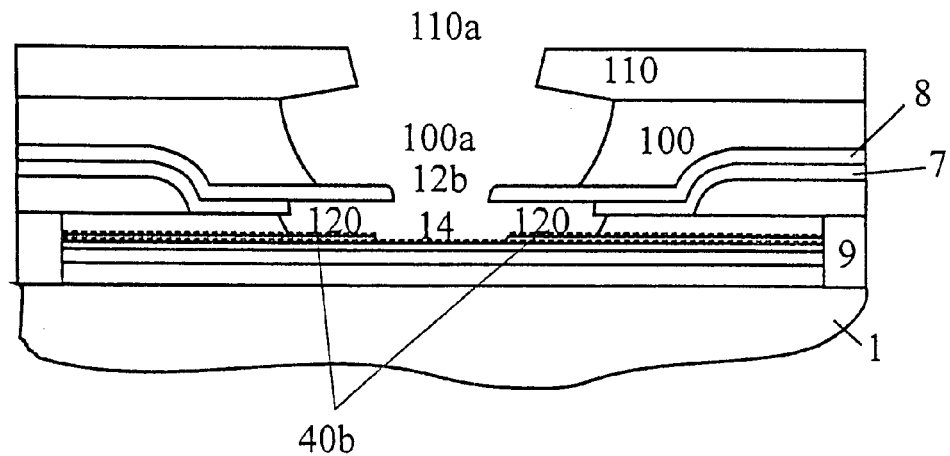
Figure 1J:
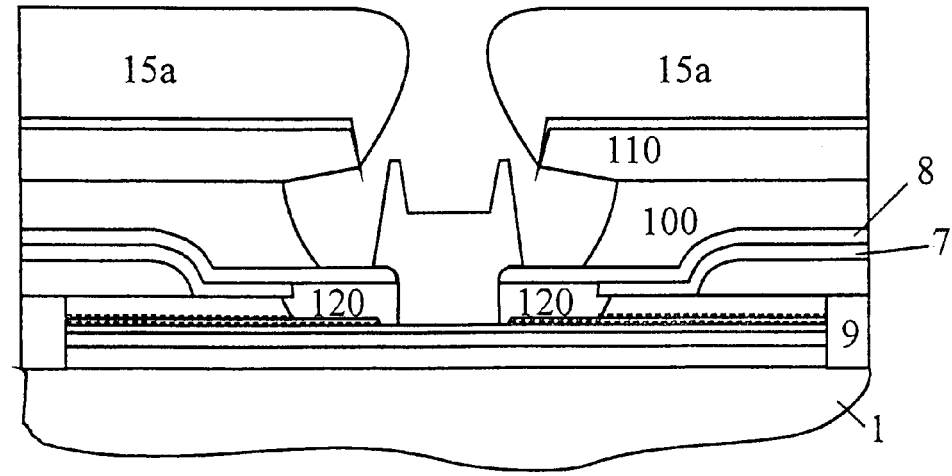

Subsequently, preferably in a common etching step, broad recess 120 in contact layer 5 and narrow recess 14 in shielding layer 4 are etched, forming the double-recess structure, and the cross-section shown in FIG. 1i is produced. The etching of the contact layer is masked laterally, in oxide layer 7, by the under-etching 12c from FIG. 1h. Stop layer 40b that remains in the center region to the side of partial recess 13 masks the etching of narrow recess 14 in shielding layer 4. In this way, the double-recess structure formed by broad recess 120 and the narrow recess 14 is formed; its lateral dimensions are already established by the opening 11a and the oxide under-etching. After removal of the exposed stop layers, gate metal 15 is vapor-deposited. In this connection, opening 12b masks the lateral metal dimension of the gate foot, and 110a that of the gate head. In this way, the T-shaped metallic gate shown in FIG. 1j is formed.

Figure 1K:
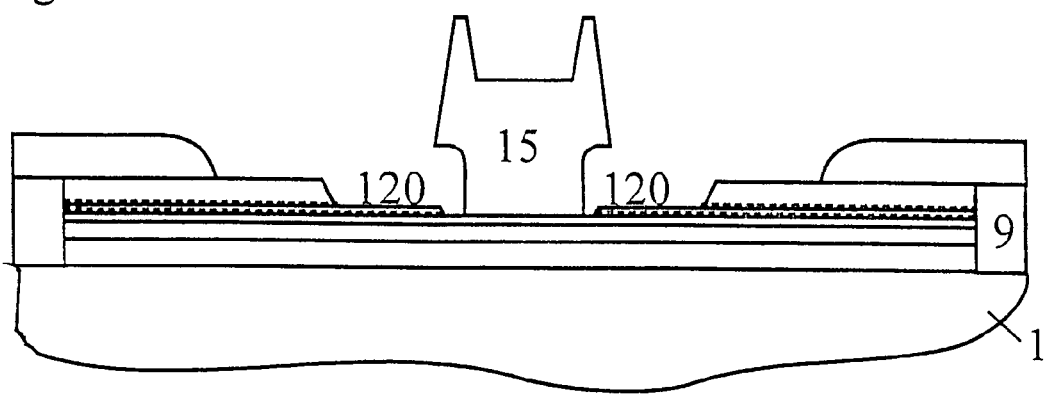
Figure 1L:
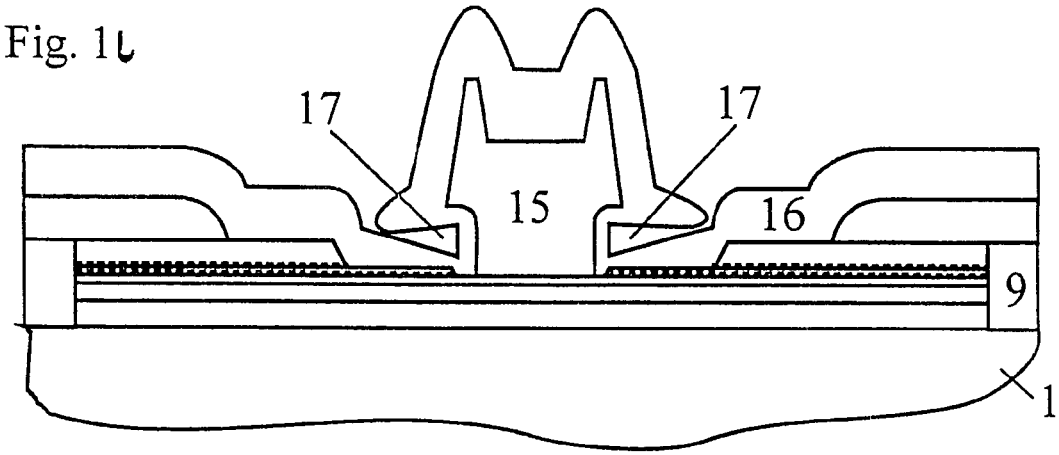

After gate lift-off, auxiliary layer 7 and intermediate layer 8 are removed, for example in an isotropic $CF_4$-based plasma (FIG. 1k), and subsequently, the surfaces of the recess structure are passivated. The cavities 17 (FIG. 1l), which advantageously reduce the feedback capacities, are formed by whole-area, essentially isotropic deposition of a passivation layer 16, preferably consisting of SiN, and because of the T-shaped gate shape.

The characteristics indicated above and in the claims, as well as those that can be derived from the figures, can advantageously be implemented both individually and in various combinations. The invention is not restricted to the exemplary embodiments described, but rather can be modified in many different ways, within the scope of the skill of a person skilled in the art.

What is claimed is:

1. A method for the production of a semiconductor component having a metallic gate electrode, having a gate head and a gate foot that is narrower than the gate head, which is disposed in a double-recess structure having a broad and a narrow recess, comprising the following steps:

depositing a semiconductor layer sequence for a field-effect transistor, the layer sequence comprising:
  a channel layer;
  a barrier layer above the channel layer;
  a low-doped shielding layer above the barrier layer;
  a stop layer lying on top of the shielding layer; and
  a highly doped contact layer above the stop layer;
depositing an intermediate layer and an auxiliary layer on the contact layer;
producing a first opening that determines a structure of the gate foot in the auxiliary layer and the intermediate layer;
transferring the first opening into the contact layer, up to the stop layer, with a structure of the narrow recess, as a first partial recess;
under-etching the auxiliary layer with a structure of the broad recess, by selective etching of the intermediate layer;
producing an opening in the stop layer with the first partial recess as a mask;
widening the partial recess in the contact layer to form the broad recess, with the structure in the intermediate layer as a mask;
exposing the narrow recess in the shielding layer up to the barrier layer, with the opening in the stop layer; and
depositing gate metal for the gate foot into the narrow recess, with the opening in the auxiliary layer as a mask, and for the gate head, onto the auxiliary layer.

2. A method according to claim 1, further comprising depositing an etch stop layer that lies on top of the barrier layer during the step of depositing the semiconductor layer sequence.

3. A method according to claim 1, further comprising the step of removing exposed stop layers that still remain in the double-recess structure after etching of the double-recess structure and before deposition of the gate metal.

4. A method according to claim 1, further comprising the step of removing the auxiliary layer and the intermediate layer after deposition of the gate metal.

5. A method according to claim 4, further comprising the step of depositing a passivation layer after the step of removing the auxiliary layer and the intermediate layer.

6. A method according to claim 1, wherein the gate head is produced using a lift-off method.

7. A method according to claim 6, wherein a mask for the lift-off method is produced in resist layers above the auxiliary layer, before production of the double-recess structure, and maintained until deposition of the gate metal.

8. A method according to claim 7, wherein the opening in the auxiliary layer and the intermediate layer is produced in a self-adjusting manner, relative to a mask structure in the resist layers for the gate head.

* * * * *